(12) United States Patent
Kim et al.

(10) Patent No.: US 12,235,484 B2
(45) Date of Patent: Feb. 25, 2025

(54) POLARIZING PLATE

(71) Applicant: LG CHEM, LTD., Seoul (KR)

(72) Inventors: Eun Je Kim, Daejeon (KR); Je Hyuk Yoo, Daejeon (KR); Woo Yong Cho, Daejeon (KR); Yun Ki Park, Daejeon (KR); Byeong Won Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 467 days.

(21) Appl. No.: 17/635,657

(22) PCT Filed: Sep. 21, 2020

(86) PCT No.: PCT/KR2020/012675
§ 371 (c)(1),
(2) Date: Feb. 15, 2022

(87) PCT Pub. No.: WO2021/060779
PCT Pub. Date: Apr. 1, 2021

(65) Prior Publication Data
US 2022/0291436 A1    Sep. 15, 2022

(30) Foreign Application Priority Data

Sep. 23, 2019 (KR) .................. 10-2019-0116807

(51) Int. Cl.
G02B 5/20 (2006.01)
G02B 1/14 (2015.01)
G02B 5/30 (2006.01)
H10K 50/80 (2023.01)

(52) U.S. Cl.
CPC ............. *G02B 5/3083* (2013.01); *G02B 1/14* (2015.01); *H10K 50/868* (2023.02)

(58) Field of Classification Search
CPC ...... G02B 5/3083; G02B 1/14; G02B 5/3016; G02B 1/11; G02B 5/30; G02B 1/04; G02B 1/10; H10K 50/868; H10K 59/8791
See application file for complete search history.

(56) References Cited

U.S. PATENT DOCUMENTS

| | | | |
|---|---|---|---|
| 2015/0168624 A1 | 6/2015 | Yaginuma et al. | |
| 2015/0185384 A1* | 7/2015 | Watanabe | G02B 5/3083 359/487.02 |
| 2015/0378076 A1* | 12/2015 | Gam | G02F 1/13363 349/193 |

(Continued)

FOREIGN PATENT DOCUMENTS

| | | |
|---|---|---|
| CN | 104364683 A | 2/2015 |
| CN | 106233171 A | 12/2016 |
| EP | 3 528 015 A1 | 8/2019 |

(Continued)

*Primary Examiner* — Wyatt A Stoffa
*Assistant Examiner* — John Curtis Sipes
(74) *Attorney, Agent, or Firm* — BRYAN CAVE LEIGHTON PAISNER LLP

(57) ABSTRACT

The present application can provide a thin polarizing plate having excellent antireflection performance in all directions including the side as well as the front, and having excellent folding durability and durability against short wavelengths. In addition, the present application can provide an organic light-emitting display device to which the polarizing plate is applied and a display device comprising the same.

12 Claims, 2 Drawing Sheets

(56) References Cited

U.S. PATENT DOCUMENTS

2019/0079231 A1* 3/2019 Sumimura ........... G02B 5/3083

FOREIGN PATENT DOCUMENTS

| | | |
|---|---|---|
| JP | 2000035512 | 2/2000 |
| JP | 2010284840 A | 12/2010 |
| JP | 2014026266 A | 2/2014 |
| JP | 2014167922 A | 9/2014 |
| JP | 2014206725 A | 10/2014 |
| JP | 2018200463 A | 12/2018 |
| JP | 2019135561 A | 8/2019 |
| KR | 10-2013-0066305 A | 6/2013 |
| KR | 10-1436441 B1 | 9/2014 |
| KR | 10-2015-0011825 A | 2/2015 |
| KR | 10-2015-0101841 A | 9/2015 |
| KR | 10-2017-0079651 A | 7/2017 |
| KR | 10-2017-0117961 A | 10/2017 |
| KR | 10-2017-0122163 A | 11/2017 |
| KR | 10-2018-0041610 A | 4/2018 |
| KR | 10-2019-0030625 A | 3/2019 |
| KR | 10-2019-0072151 A | 6/2019 |
| KR | 10-2019-0072168 A | 6/2019 |
| KR | 10-2019-0072460 A | 6/2019 |
| TW | 201821261 A | 6/2018 |
| WO | 2013191010 A1 | 12/2013 |
| WO | 2017086338 A1 | 5/2017 |

* cited by examiner

[Figure 1]
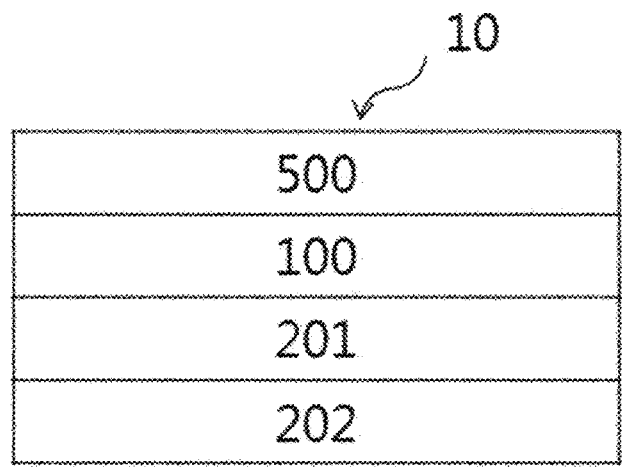
[Figure 2]
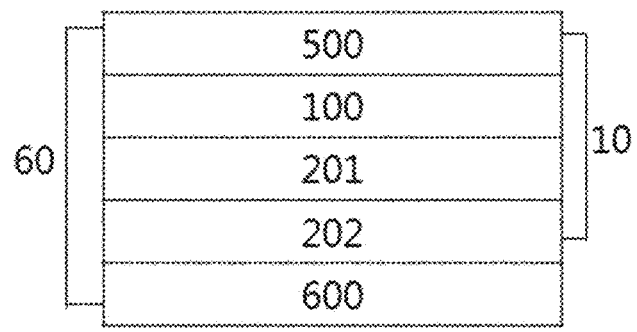

[Figure 3]
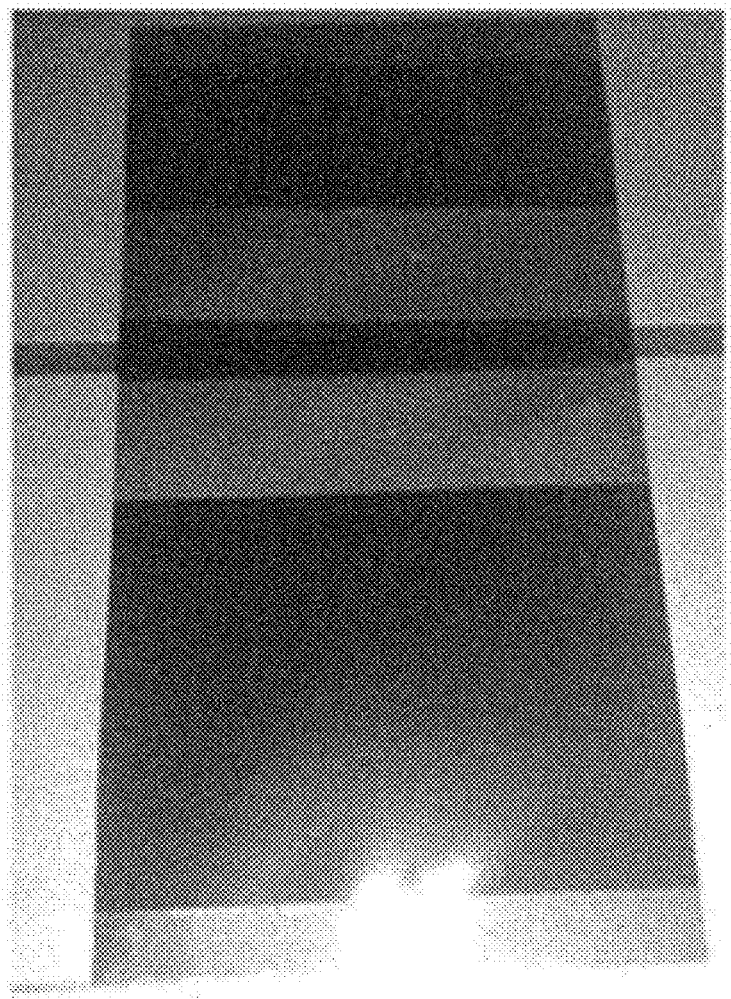
[Figure 4]
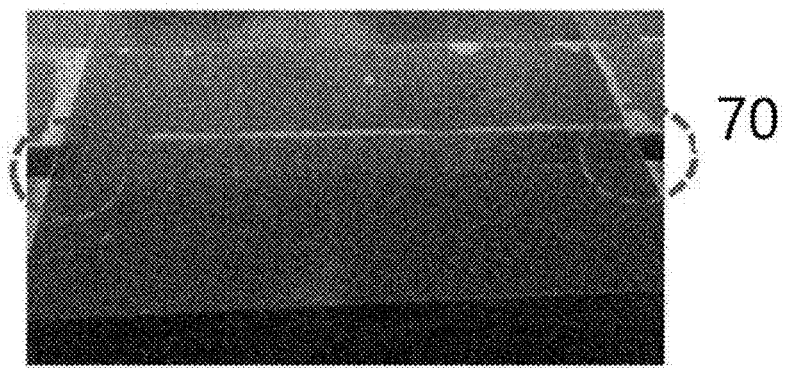

POLARIZING PLATE

The present application is a National Phase entry pursuant to 35 U.S.C. § 371 of International Application No. PCT/KR2020/012675 filed Sep. 21, 2020, and claims priority to and the benefit of Korean patent application no. KR10-2019-0116807 filed Sep. 23, 2019, the entire contents of which are incorporated herein by reference.

FIELD

The present application relates to a polarizing plate, an organic light-emitting display device, and a display device.

BACKGROUND

An organic light-emitting device (OLED) is a self-luminescent display device emitting light by itself, which requires no separate backlight, so that the thickness can be reduced, and advantageously can be formed as a flexible display device.

However, in the organic light-emitting display device, there are problems that visibility and contrast ratios are deteriorated due to reflection of external light by metal electrodes and metal wiring formed on the organic light-emitting display panel, thereby resulting in poor display quality, and lifespan is reduced when exposed to light in a short wavelength range for a long time. In addition, as the demand level for weight saving and thinning of monitors or televisions, and the like increases, it is continuously required to implement organic light-emitting display devices to be lighter and thinner, and quality deterioration, such as crack occurrence, due to folding of a flexible display device, is also a problem.

SUMMARY

It is one object of the present application to provide a thin polarizing plate having excellent antireflection performance in all directions including the side as well as the front, having excellent folding durability, and durability against light with short wavelengths.

It is another object of the present application to provide an organic light-emitting display device to which a polarizing plate is applied, and a display device comprising the same.

According to one aspect, there is provided A polarizing plate comprising a polarizing film; a hard coating layer formed on the top of the polarizing film; and a retardation layer formed on the bottom of the polarizing film.

BRIEF DESCRIPTION OF THE DRAWINGS

FIG. 1 is an exemplary schematic illustration of a polarizing plate of the present application.

FIG. 2 is an exemplary schematic illustration showing an organic light-emitting display device including the polarizing plate of FIG. 1.

FIG. 3 shows a state after a folding test on the polarizing plate of Example 1.

FIG. 4 shows a state after a folding test on the polarizing plate of Comparative Example 1.

DETAILED DESCRIPTION

The reference wavelength of optical properties, such as phase differences or refractive indices, as mentioned in this specification, is approximately 550 nm, unless otherwise specified.

In this specification, the term in-plane retardation is an optical property defined by Equation 1 below, and the term thickness direction retardation is an optical property defined by Equation 2 below.

$$R_{in}=d\times(n_x-n_y) \quad \text{[Equation 1]}$$

$$R_{th}=d\times(n_z-n_y) \quad \text{[Equation 2]}$$

In Equations 1 and 2, $R_{in}$ is the in-plane retardation, $R_{th}$ is the thickness direction retardation, d is the thickness of a first or second retardation layer, $n_x$ is the refractive index of the first or second retardation layer in the slow axis direction, $n_y$ is the refractive index of the first or second retardation layer in the fast axis direction, and $n_z$ is the refractive index of the first or second retardation layer in the thickness direction.

Here, the term layer is a layer to be measured for the in-plane retardation or the thickness direction retardation, and thus, for example, the layer in the equations for obtaining the in-plane retardation or the thickness direction retardation of the retardation layer is the retardation layer.

In this specification, the terms vertical, horizontal, orthogonal, parallel and angular numerical values, which define angles, are substantially vertical, horizontal, orthogonal, parallel, and numerical values, may include an error within approximately ±10 degrees, within ±9 degrees, within ±8 degrees, within ±7 degrees, within ±6 degrees, within ±5 degrees, within ±4 degrees, within ±3 degrees, within ±2 degrees or within ±1 degree.

The polarizing plate of the present application may comprise a polarizing film, a hard coating layer formed on the top of the polarizing film and a retardation layer formed on the bottom of the polarizing film. The retardation layer may have a single layer structure or may be a laminate with a multilayer structure. In this specification, the term bottom means a direction from the polarizing film toward the retardation layer, and the top means the opposite direction. In one example, when the polarizing plate of the present application has been applied to an organic light-emitting display device, the bottom may coincide with the direction from the polarizing plate toward an organic light-emitting display panel to be described below, and the top may coincide with the direction toward the viewer side.

In one example, the polarizing plate of the present application may be a polarizing plate in which the hard coating layer is formed directly on the polarizing film without interposing another layer.

Typically, when using an organic light-emitting display device, a protective film may be applied thereto to protect the polarizing film so that scratches and the like do not occur on the polarizing film. The protective film may be a glass substrate and/or a polymer film.

However, in the polarizing plate of the present application, for example, the hard coating layer may be directly formed on the top of the polarizing film without applying another layer such as the protective film, and without interposing other layers. As the hard coating layer having characteristics to be described below is directly formed on the top of the polarizing film without interposing other layers as above, it can reduce the total thickness of the polarizing plate while serving to protect the polarizing film upon handling and/or using the organic light-emitting display device. Accordingly, it is possible to provide a thin polarizing plate having not only excellent durability against short wavelengths, but also excellent folding durability.

In this specification, the hard coating layer may be a layer having pencil hardness equal to or more than a certain level.

The pencil hardness may be measured by a method of drawing a pencil lead on the surface of the hard coating layer with a load of 500 g and at an angle of 45 degrees under a temperature of about 25° C. and 50% relative humidity using a general pencil hardness measuring instrument. The pencil hardness may be measured by increasing the hardness of the pencil lead in stages until occurrence of defects such as impressions, scratches or rupture on the surface of the hard coating layer is confirmed.

In one example, the hard coating layer of the present application may have pencil hardness of about 0.5H or more, and in another example, the pencil hardness may be about 0.6H or more, 0.7H or more, 0.8H or more, 0.9H or more, 1H or more, or 2H or more, or may be 10H or less, 9H or less, 8H or less, 7H or less, 6H or less, 5H or less, 4H or less, 3H or less, or 2H or less.

In one example, the hard coating layer may have a thickness in a range of 1 μm to 10 μm. In another example, the thickness may be 1.5 μm or more, 2.0 μm or more, 2.5 μm or more, 3 μm or more, or may be 9 μm or less, 8 μm or less, 7 μm or less, 6 μm or less, 5 μm or less, 4 μm or less, or 3 μm or less.

As the hard coating layer controlling the thickness as above and/or formed of a material to be described below, while having the pencil hardness in the above range, is applied thereto, it can protect the polarizing plate against external impact and/or short wavelength light even if it is formed alone without interposing another layer on the top of the polarizing film, and the folding durability of the polarizing plate can also be achieved through reduction of the thickness of the polarizing plate or the like.

As such a material for forming the hard coating layer, a known material applied to forming the hard coating layer on the polarizing plate may be used. The hard coating layer formed on the polarizing plate generally includes a hard coating layer formed on the surface of a protective film attached to one side of a polarizing film, or a hard coating layer formed on a so-called single-sided polarizing plate that a protective film is attached to one side of a polarizing film, and a hard coating layer and a pressure-sensitive adhesive layer are sequentially formed on the other side, where the material applied to form such a hard coating layer can also be applied equally to the polarizing plate of the present application. In one example, as the hard coating layer, a hard coating layer comprising a polymerizable epoxy compound and/or an oxetane compound may be applied. Such a material can be exemplified by, for example, materials known as the protective layer material formed on one side of the polarizing film in Korean Laid-Open Patent Publication No. 2019-0072151, Korean Laid-Open Patent Publication No. 2019-0072168 or Korean Laid-Open Patent Publication No. 2019-0072460, and the like.

The hard coating layers in the prior arts as described above were not directly formed on the upper surface of the polarizing film in consideration of, for example, tearing of the polarizing film or the like. That is, the hard coating layer applied to the conventional polarizing plate was formed on the surface of the protective film attached to the polarizing plate without being formed directly on the polarizing film, or even if it was formed directly on the polarizing film, it was formed on the bottom of the polarizing film, that is, the surface of the polarizing film facing the display device when the polarizing plate was applied to the display device. However, the present inventors have found that by applying the hard coating layer to a polarizing plate having a unique structure described in this specification, it is possible to provide a polarizing plate having excellent folding durability and short wavelength durability along with other desired physical properties.

For example, the polarizing plate of the present application may have a reflective color value change of 10 or less according to Equation 4 below.

$$\Delta E^*_{ab} = [(\Delta L^*)^2 + (\Delta a^*)^2 + (\Delta b^*)^2]^{1/2}$$ [Equation 4]

In Equation 4, $\Delta L^*$ may be $L^*_a - L^*_i$, $\Delta a^*$ may be $a^*_a - a^*_i$, $\Delta b^*$ may be $b^*_a - b^*_i$, and $L^*_a$, $a^*_a$ and $b^*_a$ may be color coordinates L*, a* and b* before exposing the polarizing plate to light having a wavelength of 420 nm in a light quantity of 0.75 to 0.85 W/m² at a temperature of 25° C. for 50 hours, respectively, and $L^*_i$, $a^*_i$ and $b^*_i$ may be color coordinates L*, a* and b* after exposing the polarizing plate to light having a wavelength of 420 nm in a light quantity of 0.75 to 0.85 W/m² at a temperature of 25° C. for 50 hours.

The L, a and b values may mean L, a and b of the CIE Lab color space as described below. In this color space, the L value represents brightness, wherein an L value of 0 indicates black and an L value of 100 indicates white. Also, when the a value is negative, the color is biased toward green, and when it is positive, the color is biased toward red or purple. In addition, when the b value is negative, the color is biased to blue, and when the b value is positive, the color is biased to yellow.

Each numerical value in the CIE Lab color space can be measured by applying a general method of measuring each coordinate of the color space, and for example, after placing a spectrophotometer (KONICA MINOLTA, CM-2600d) having a detector in the form of an integrating sphere at the measurement position, it can be measured according to the manufacturer's manual. Such a measurement may be performed under a temperature condition of 20° C. to 30° C. and a humidity condition of 40 to 50%, but is not limited thereto.

In another example, the reflective color value change ($\Delta E^*_{ab}$) of the polarizing plate in the present application according to Equation 4 above may be 9 or less, 8 or less, 7 or less, 6 or less, 5 or less, 4 or less, 3 or less, 2.9 or less, 2.8 or less, 2.7 or less, 2.6 or less, 2.5 or less, 2.4 or less, 2.3 or less, 2.2 or less, 2.1 or less, 2.0 or less, 1.9 or less, 1.8 or less, 1.7 or less, 1.6 or less, 1.5 or less, 1.4 or less, 1.3 or less, 1.2 or less, 1.1 or less, 1.0 or less, 0.9 or less, 0.8 or less, 0.7 or less, 0.6 or less, 0.5 or less, 0.4 or less, 0.3 or less, or 0.2 or less, but is not limited thereto.

The polarizing plate of the present application particularly introduces the above-described hard coating layer on the polarizing film without interposing other layers, whereby a polarizing plate forming the thickness thin and simultaneously controlling the problem such as the lifespan reduction of the polarizing plate even when it is exposed to a short wavelength for a long time, can be provided.

In one example, the polarizing plate of the present application may have a thickness of 45 μm or less. In another example, the thickness of the polarizing plate may be 44 μm or less, 43 μm or less, 42 μm or less, 41 μm or less, 40 μm or less, 39 μm or less, 38 μm or less, 37 μm or less, 36 μm or less, or 35 μm or less, or may be 5 μm or more, 10 μm or more, 15 μm or more, 20 μm or more, 25 μm or more, 30 μm or more, or 35 μm or more, but is not limited thereto.

By controlling the thickness of the polarizing plate in the above range, it is possible to provide a polarizing plate that does not cause appearance defects such as cracks during folding, and by applying the polarizing plate to an organic light-emitting display device and a flexible display device comprising the same, it is possible to provide a flexible display device having excellent folding durability.

The polarizing plate of the present application may also comprise a retardation layer on the bottom of the polarizing film. The retardation layer may have a single layer structure or a multilayer structure. In the case of a multilayer structure, the retardation layer may comprise, for example, a first retardation layer and/or a second retardation layer. In one example, the first retardation layer is present on the bottom of the polarizing film, and the second retardation layer is present on the bottom of the first retardation layer, so that the hard coating layer (500), the polarizing film (100), the first retardation layer (201) and the second retardation layer (202) may be sequentially laminated as in FIG. 1.

In this positional relationship, the optical properties of each retardation layer are designed as follows, whereby a polarizing plate having excellent antireflection performance and/or color characteristics in all directions including the side as well as the front, and also having short wavelength durability can be provided when it is applied to a display device, especially an organic light-emitting display device.

In this specification, the term retardation layer means an element which is an optically anisotropic layer and is capable of converting incident polarized light by controlling birefringence. In this specification, unless otherwise specified while describing the x-axis, y-axis and z-axis of the retardation layer, the x-axis means a direction parallel to the in-plane slow axis of the retardation layer, and the y-axis means a direction parallel to the in-plane fast axis of the retardation layer, and the z-axis means the thickness direction of the retardation layer. The x-axis and y-axis may be orthogonal to each other in the plane.

In the first retardation layer, the in-plane retardation (based on a wavelength of 550 nm) of Equation 1 above may be in a range of about 100 to 150 nm. In another example, the in-plane retardation may be about 110 nm or more, 120 nm or more, 130 nm or more, 131 nm or more, 132 nm or more, 133 nm or more, 134 nm or more, 135 nm or more, 136 nm or more, 137 nm or more, 138 nm or more, 139 nm or more, or 140 nm or more, or may be 149 nm or less, 148 nm or less, 147 nm or less, 146 nm or less, 145 nm or less, 144 nm or less, 143 nm or less, 142 nm or less, or 141 nm or less.

In such an arrangement of the polarizing plate, the first retardation layer may be arranged such that, for example, the slow axis may form an angle in a range of approximately 35 degrees to 55 degrees with the absorption axis of the polarizing film. In another example, the angle may be approximately 15 degrees or more, 20 degrees or more, 25 degrees or more, 30 degrees or more, 35 degrees or more, 40 degrees or more, or 45 degrees or more, or may be 65 degrees or less, 60 degrees or less, 55 degrees or less, 50 degrees or less, or 45 degrees or less or so. More preferably, it may be arranged to form an angle in the range of approximately 40 degrees to 50 degrees, but is not limited thereto.

In the present application, the first retardation layer may also have a dispersion coefficient of less than 1 according to Equation 3 below.

$$\text{Dispersion coefficient} = R_{in}(450)/R_{in}(550) \qquad \text{[Equation 3]}$$

In Equation 3, $R_{in}(450)$ is the in-plane retardation of the first retardation layer based on a wavelength of 450 nm, and $R_{in}(550)$ is the in-plane retardation of the first retardation layer based on a wavelength of 550 nm.

In the present application, the first retardation layer may also be a QWP (quarter wave plate). In this specification, the term QWP means a wave plate having a ¼ wavelength phase retardation characteristic, wherein the wave plate serves to change incident polarized light, which is linearly polarized light, into circularly polarized light. In this specification, the n-wavelength phase retardation characteristic means a characteristic capable of retarding incident light by n times the wavelength of the incident light within at least a partial wavelength range. Accordingly, the ¼ wavelength phase retardation characteristic may mean a characteristic capable of retarding the incident light by ¼ times the wavelength of the incident light within at least a partial wavelength range.

In one example, the first retardation layer of the present application may have a thickness of 25 μm or less. In another example, the thickness may be 24 μm or less, 23 μm or less, 22 μm or less, 21 μm or less, 20 μm or less, 19 μm or less, 18 μm or less, 17 μm or less, 16 μm or less, 15 μm or less, 14 μm or less, 13 μm or less, 12 μm or less, 11 μm or less, 10 μm or less, 9 μm or less, 8 μm or less, 7 μm or less, 6 μm or less, 5 μm or less, 4 μm or less, or 3 μm or less, or may be 0.1 μm or more, 0.2 μm or more, 0.3 μm or more, 0.4 μm or more, 0.5 μm or more, 0.6 μm or more, 0.7 μm or more, 0.8 μm or more, 0.9 μm or more, 1.0 μm or more, 1.1 μm or more, 1.2 μm or more, 1.3 μm or more, 1.4 μm or more, 1.5 μm or more, 1.6 μm or more, 1.7 μm or more, 1.8 μm or more, or 1.9 μm or more, but is not limited thereto, as long as it can exhibit the desired phase difference.

In this way, by applying the first retardation layer, in which the slow axis of the first retardation layer and the absorption axis of the polarizing film are disposed within the above range, while showing the in-plane retardation in the above range, it is possible to exhibit an appropriate level of compensation function according to the wavelength in the visible light region through a combination with the second retardation layer to be described below, whereby excellent omnidirectional antireflection performance, color characteristics and/or short wavelength durability can be secured.

The polarizing plate of the present application may comprise, for example, a second retardation layer on the bottom of the first retardation layer. At this time, the second retardation layer may be in contact with the first retardation layer, or other elements, for example, a pressure-sensitive adhesive layer and the like, or a polymer film and the like may also be present between the first and second retardation layers.

In the second retardation layer, the thickness direction retardation (based on a wavelength of 550 nm) of Equation 2 above may be in a range of approximately 30 nm to 150 nm. In another example, the thickness direction retardation may be approximately 35 nm or more, 40 nm or more, 45 nm or more, 50 nm or more, 55 nm or more, or 60 nm or more, or may be 140 nm or less, 130 nm or less, 120 nm or less, 110 nm or less, 100 nm or less, 90 nm or less, 80 nm or less, or 70 nm or less.

In one example, the second retardation layer may be a layer that does not substantially have an in-plane retardation. The in-plane retardation (based on a wavelength of 550 nm) of such a second retardation layer may be, for example, approximately 10 nm or less, 9 nm or less, 8 nm or less, 7 nm or less, 6 nm or less, 5 nm or less, 4 nm or less, 3 nm or less, 2 nm or less, or 1 nm or less, or substantially 0 nm.

The second retardation layer has substantially no in-plane retardation, as described above, and thus the arrangement of its slow axis does not significantly affect the performance of the polarizing plate. However, when there is a slow axis in the second retardation layer, the arrangement may be vertical or horizontal with the absorption axis of the polarizing layer.

In one example, the second retardation layer of the present application may have a thickness of 10 μm or less. In another example, the thickness may be 9 μm or less, 8 μm or less, 7 μm or less, 6 μm or less, 5 μm or less, 4 μm or less, 3 μm or less, or 2 μm or less, or may be 0.1 μm or more, 0.2 μm or more, 0.3 μm or more, 0.4 μm or more, 0.5 μm or more, 0.6 μm or more, 0.7 μm or more, 0.8 μm or more, or 0.9 μm or more, but is not limited thereto, as long as it can exhibit the desired phase difference.

The range of the thickness direction retardation or the like in the second retardation layer is controlled as above and the second retardation layer is combined with the above-described first retardation layer at a predetermined position, whereby the effect suitable for the purpose of the present application can be achieved.

As the first and second retardation layers, various types of retardation layers may be used without limitation, as long as the above-mentioned characteristics are satisfied.

In general, as the retardation layer, a polymer film that optical anisotropy is imparted by stretching such as uniaxial or biaxial stretching, or a liquid crystal film or liquid crystal polymer film formed by orienting and polymerizing a polymerizable liquid crystal compound (so-called RM (reactive mesogen)), and the like is applied, and as long as the above-described characteristics are satisfied, all of such known retardation layers may be used.

In one example, the first and/or second retardation layer may be a liquid crystal film or liquid crystal polymer film formed by orienting and polymerizing a polymerizable liquid crystal compound, and in this case, the first and/or second retardation layer may be referred to as the first and/or second liquid crystal retardation layer. Various polymerizable liquid crystal compounds (so-called RM (reactive mesogen)) that can be applied to the production of the liquid crystal film or liquid crystal polymer film are known, and a method of producing a liquid crystal film or a liquid crystal polymer film by applying the same is known. As such a polymerizable liquid crystal compound, a so-called polymerizable nematic liquid crystal compound or polymerizable smectic liquid crystal compound, and the like are known. Although it is effective to apply such a polymerizable liquid crystal compound from the viewpoint of easiness of adjustment of the dispersion coefficient, other types of liquid crystal compounds are applicable as long as the requirements of the present application are satisfied.

The stretched polymer film can be exemplified by, for example, a polyolefin film such as a polyethylene film or a polypropylene film, a cycloolefin polymer film such as a polynorbornene film, an acrylic film, a polyvinyl chloride film, a polyacrylonitrile film, a polysulfone film, a polyacrylate film, a polyvinyl alcohol film or a cellulose ester-based film such a TAC (triacetyl cellulose) film, or a polyester film such as a PET (poly(ethylene terephthalate)) film or a PC (polycarbonate) film, or a copolymer film of two or more monomers among the monomers forming the polymers, and the like. In one example, as the polymer film, a cycloolefin polymer film or an acrylic film may be used. Here, the cycloolefin polymer can be exemplified by a ring-opening polymer of cycloolefin such as norbornene or a hydrogenated product thereof, an addition polymer of cycloolefin, a copolymer of cycloolefin and another comonomer such as alpha-olefin, or a graft polymer that the polymer or the copolymer is modified with an unsaturated carboxylic acid or a derivative thereof, and the like, but is not limited thereto.

The polarizing plate of the present application may comprise other elements on the top and/or the bottom of the polarizing film and the first and second retardation layers. However, the polarizing plate may comprise only the first and second retardation layers as retardation layers. That is, the polarizing plate may further comprise only a so-called isotropic layer except for the polarizing layer and the first and second retardation layers.

The isotropic layer mentioned in this specification is a substantially isotropic layer, which may be treated as an isotropic layer as long as it has a phase difference that does not damage the optical structure designed for the polarizing plate, even if the relevant layer has a certain phase difference. In one example, the term isotropic layer, which is mentioned in the present application, is a layer in which the in-plane retardation and the thickness direction retardation are simultaneously 20 nm or less. In another example, the retardation may be 19 nm or less, 18 nm or less, 17 nm or less, 16 nm or less, 15 nm or less, 14 nm or less, 13 nm or less, 12 nm or less, 11 nm or less, 10 nm or less, 9 nm or less, 8 nm or less, 7 nm or less, 6 nm or less, 5 nm or less, 4 nm or less, 3 nm or less, 2 nm or less, or 1 nm or less, or may be 0 nm. Thus, on the contrary, a layer in which any of the in-plane retardation and the thickness direction retardation exceeds 20 nm may be treated as the retardation layer in the present application.

The polarizing plate of the present application further comprises, for example, an isotropic layer, wherein the retardation layer may be formed on the first surface of the isotropic layer sequentially and the second surface of the isotropic layer may be attached to the polarizing film.

The isotropic layer may be, for example, a triacetyl cellulose film, a cycloolefin polymer film, a polyethylene terephthalate film, a polycarbonate film, a polyvinyl chloride film, a polyacrylonitrile film, a polysulfone film, a polyacrylate film or a polyvinyl alcohol film, and the like, but is not limited thereto.

The isotropic layer may have a thickness, for example, in a range of 5 μm to 35 μm. By controlling the thickness of the isotropic layer as above, it is possible to secure folding durability and the like according to the thinning of the polarizing plate. In another example, the thickness of the isotropic layer may be 6 μm or more, 7 μm or more, 8 μm or more, 9 μm or more, 10 μm or more, 11 μm or more, 12 μm or more, 13 μm or more, 14 μm or more, 15 μm or more, 16 μm or more, 17 μm or more, 18 μm or more, or 19 μm or more, or may be 34 μm or less, 33 μm or less, 32 μm or less, 31 μm or less, 30 μm or less, 29 μm or less, 28 μm or less, 27 μm or less, 26 μm or less, 25 μm or less, 24 μm or less, 23 μm or less, 22 μm or less, or 21 μm or less.

In the polarizing plate of the present application, for example, by controlling a ratio (H/P) of the thickness of the hard coating layer (H) to the thickness of the isotropic layer (P), a ratio (H/T) of the thickness of the hard coating layer (H) to the thickness of the retardation layer (T) and/or a ratio (H/S) of the thickness (H) of the hard coating layer to the thickness (S) of the polarizing film in predetermined ranges, the desired effect can be further maximized.

In one example, the ratio (H/P) of the thickness (H) of the hard coating layer to the thickness (P) of the isotropic layer may be 0.01 to 1.5. In another example, the ratio (H/P) of the thickness (H) of the hard coating layer to the thickness (P) of the isotropic layer may be 0.02 or more, 0.03 or more, 0.04 or more, 0.05 or more, 0.06 or more, 0.07 or more, 0.08 or more, 0.09 or more, 0.10 or more, 0.11 or more, 0.12 or more, 0.13 or more, or 0.14 or more, or may be 1.4 or less, 1.3 or less, 1.2 or less, 1.1 or less, 1.0 or less, 0.9 or less, 0.8 or less, 0.7 or less, 0.6 or less, 0.5 or less, 0.4 or less, 0.3 or less, 0.2 or less, 0.19 or less, 0.18 or less, 0.17 or less, or 0.16 or less.

In one example, the ratio (H/T) of the thickness (H) of the hard coating layer to the thickness (T) of the retardation layer may be 0.1 to 5. Here, the thickness of the retardation layer may mean a thickness of a single layer structure when the retardation layer has the single layer structure, and may mean the total thickness of all thickness of the respective layers when the retardation layer is a laminate of two or more layers. In one example, when the retardation layer has a two-layer structure of a first retardation layer and a second retardation layer, the thickness (T) of the retardation layer may mean the sum of the thickness (T1) of the first retardation layer and the thicknesses (T2) of the second retardation layer. In another example, the ratio (H/T) of the thickness (H) of the hard coating layer to the thickness (T) of the retardation layer may be 0.2 or more, 0.3 or more, 0.4 or more, 0.5 or more, 0.6 or more, 0.7 or more, 0.8 or more, or 0.9 or more, or may be 4.5 or less, 4.0 or less, 3.5 or less, 3.0 or less, 2.5 or less, 2.0 or less, or 1.5 or less.

In one example, the ratio (H/S) of the thickness (H) of the hard coating layer to the thickness (S) of the polarizing film may be 0.01 to 1.5. The ratio (H/S) of the thickness (H) of the hard coating layer to the thickness (S) of the polarizing film may be 0.05 or more, 0.1 or more, 0.15 or more, 0.20 or more, 0.25 or more, 0.30 or more, 0.35 or more, or 0.40 or more, or may be 1.4 or less, 1.3 or less, 1.2 or less, 1.1 or less, 1.0 or less, 0.9 or less, 0.8 or less, 0.7 or less, 0.6 or less, or 0.5 or less.

By controlling the thickness ratios between the hard coating layer and the other layers in predetermined ranges as described above, it is possible to provide a polarizing plate having excellent effects such as pencil hardness, short wavelength durability and/or folding durability.

The polarizing plate of the present application may further comprise a pressure-sensitive adhesive layer. This pressure-sensitive adhesive layer may be included in order to attach the polarizing plate of the present application to the display device. Therefore, the pressure-sensitive adhesive layer may be formed on the bottom of the retardation layer. Accordingly, the polarizing plate of the present application may comprise the hard coating layer, the polarizing film, the retardation layer and the pressure-sensitive adhesive layer in this order. In one example, the pressure-sensitive adhesive layer in the polarizing plate may be formed only on the bottom of the retardation layer. Accordingly, in the polarizing plate structure, the pressure-sensitive adhesive layer may not be formed on the top of the hard coating layer. As the pressure-sensitive adhesive layer, a pressure-sensitive adhesive layer applied to a known polarizing plate may be applied without particular limitation.

In the present application, the polarizing film may be, for example, a polyvinyl alcohol polarizing film. In this specification, the terms polarizing film and polarizing plate refer to objects that are distinguished from each other. The polarizing film refers to a film, sheet or element itself exhibiting a polarizing function, and the polarizing film is a functional element capable of extracting light vibrating in one direction from incident light vibrating in various directions. The polarizing plate means an optical element comprising other elements together with the polarizing film. The other elements that may be included in the optical element together with the polarizing film can be exemplified by a polarizing film, protective film or a retardation layer, and the like, but are not limited thereto.

Here, the polarizing film may be an absorption type or reflective type polarizing film, without basically particular limitation. In the present application, the polarizing film may be, for example, a polyvinyl alcohol polarizing film. The term polyvinyl alcohol polarizing film may mean, for example, a resin film of polyvinyl alcohol (hereinafter, referred to as polyvinyl alcohol) series containing an anisotropic absorbing material such as iodine or a dichroic dye. Such a film can be produced by including an anisotropic absorbing material in a polyvinyl alcohol-based resin film and orienting the mixture by stretching or the like. Here, the polyvinyl alcohol-based resin may include polyvinyl alcohol, polyvinyl formal, polyvinyl acetal or a saponified product of an ethylene-vinyl acetate copolymer, and the like. The degree of polymerization of the polyvinyl alcohol-based resin may be about 100 to 5,000 or 1,400 to 4,000 or so, but is not limited thereto.

Such a polarizing film has a thickness without particular limitation, which may be formed to an appropriate thickness depending on the purpose. The thickness of the polarizing film may be, for example, in a range of 1 μm to 100 μm. In another example, the thickness may be 2 μm or more, 3 μm or more, 4 μm or more, 5 μm or more, 6 μm or more, 7 μm or more, 8 μm or more, 9 μm or more, 10 μm or more, 11 μm or more, 12 μm or more, or may be 90 μm or less, 80 μm or less, 70 μm or less, 60 μm or less, 50 μm or less, 40 μm or less, 30 μm or less, 20 μm or less, 19 μm or less, 18 μm or less, 17 μm or less, 16 μm or less, 15 μm or less, 14 μm or less, 13 μm or less, 12 μm or less, 11 μm or less, 10 μm or less, 9 μm or less, 8 μm or less, or 7 μm or less, but is not limited thereto.

Such a polyvinyl alcohol polarizing film can be produced, for example, by performing at least a dyeing process, a crosslinking process and a stretching process on a polyvinyl alcohol-based film. In the dyeing process, the crosslinking process and the stretching process, the respective treatment baths of a dyeing bath, a crosslinking bath and a stretching bath are used, respectively, and these respective treatment baths may use a treatment liquid according to each process.

In the dyeing process, the anisotropic absorbing material may be adsorbed and/or oriented on the polyvinyl alcohol-based film. This dyeing process may be performed together with the stretching process. The dyeing may be performed by immersing the film in a solution containing an anisotropic absorbing material, for example, an iodine solution. As the iodine solution, for example, an aqueous solution containing iodine ions by iodine and an iodide compound, which is a solubilizing agent, may be used. As the iodide compound, for example, potassium iodide, lithium iodide, sodium iodide, zinc iodide, aluminum iodide, lead iodide, copper iodide, barium iodide, calcium iodide, tin iodide or titanium iodide, and the like may be used. The concentration of iodine and/or iodide ions in the iodine solution may be adjusted in consideration of the optical properties of the desired polarizing film, and such a control method is known. In the dyeing process, the temperature of the iodine solution is typically about 20° C. to 50° C. or 25° C. to 40° C. or so, and the immersion time is usually about 10 seconds to 300 seconds or 20 seconds to 240 seconds, without being limited thereto.

The crosslinking process performed in the manufacturing process of the polarizing film may be performed using, for example, a crosslinking agent such as a boron compound. The order of the crosslinking process is not particularly limited, and for example, it may be performed together with the dyeing and/or stretching process, or may be performed separately. The crosslinking process may also be performed several times. As the boron compound, boric acid or borax may be used. The boron compound may be generally used in the form of an aqueous solution or a mixed solution of water and an organic solvent, and a boric acid aqueous solution is usually used. The boric acid concentration in the boric acid aqueous solution may be selected in an appropriate range in consideration of crosslinking degree and the heat resistance thereof, and the like. An iodide compound such as potassium iodide can also be contained in the boric acid aqueous solution or the like.

The crosslinking process can be performed by immersing the polyvinyl alcohol-based film in a boric acid aqueous solution or the like, and in this process, the treatment temperature is typically in the range of 25° C. or higher, 30° C. to 85° C. or 30° C. to 60° C. or so, and the treatment time is typically 5 seconds to 800 seconds or 8 seconds to 500 seconds or so.

The stretching process is generally performed by uniaxial stretching. This stretching may also be performed together with the dyeing and/or crosslinking process. The stretching method is not particularly limited, where for example, a wet stretching method may be applied. In such a wet stretching method, for example, it is common to perform stretching after dyeing, but the stretching may be performed together with crosslinking, which may also be performed multiple times or in multiple stages.

An iodide compound such as potassium iodide can be contained in the treatment liquid applied to the wet stretching method. In the stretching, the treatment temperature is usually in the range of 25° C. or higher, 30° C. to 85° C. or 50° C. to 70° C. or so, and the treatment time is usually 10 seconds to 800 seconds or 30 seconds to 500 seconds, without being limited thereto.

In the stretching process, the total draw ratio may be adjusted in consideration of orientation characteristics, and the like, and the total draw ratio may be 3 to 10 times, 4 to 8 times, or 5 to 7 times or so based on the original length of the polyvinyl alcohol-based film, but is not limited thereto. Here, in the case of accompanying stretching even in a swelling process or the like, the total draw ratio may mean the cumulative draw ratio including the stretching in each process. This total draw ratio may be adjusted to an appropriate range in consideration of orientation, processability of the polarizing film, or possibility of stretching and cutting, and the like.

In the manufacturing process of the polarizing film, a swelling process may also be performed in addition to the dyeing, crosslinking and stretching before performing the above processes. It is possible to clean contaminants or an anti-blocking agent on the surface of the polyvinyl alcohol-based film surface by swelling, whereby there is also an effect of capable of reducing unevenness such as dyeing deviation.

In the swelling process, water, distilled water or pure water, and the like may be used. The main component of the relevant treatment liquid is water, and if necessary, an iodide compound such as potassium iodide or an additive such as a surfactant, or an alcohol, and the like may be contained in a small amount.

The treatment temperature in the swelling process is usually 20° C. to 45° C. or 20° C. to 40° C. or so, but is not limited thereto. Since swelling deviation can cause dyeing deviation, the process parameters can be adjusted so that the occurrence of such swelling deviation is suppressed as much as possible.

If necessary, suitable stretching may also be performed in the swelling process. The draw ratio may be 6.5 times or less, 1.2 to 6.5 times, 2 to 4 times, or 2 to 3 times or so, based on the original length of the polyvinyl alcohol-based film. The stretching in the swelling process can be controlled so that the stretching in the stretching process performed after the swelling process can be controlled to be small, and can be controlled so that the stretching breakage of the film does not occur.

In the manufacturing process of the polarizing film, a metal ion treatment may be performed. Such a treatment is performed, for example, by immersing a polyvinyl alcohol-based film in an aqueous solution containing a metal salt. Through this, it is possible to contain metal ions in a polarizer, and in this process, by adjusting the type or ratio of metal ions, it is possible to adjust the color tone of the polyvinyl alcohol-based polarizing film. The applicable metal ions can be exemplified by metal ions of a transition metal such as cobalt, nickel, zinc, chromium, aluminum, copper, manganese or iron, and it is also possible to adjust the color tone by selecting an appropriate type thereof.

In the manufacturing process of the polarizing film, a washing process may be performed after dyeing, crosslinking and stretching. Such a washing process can be performed with water or a solution of an iodine compound such as potassium iodide.

The washing with water and the washing with an iodine compound solution may also be combined, and a solution containing a liquid alcohol such as methanol, ethanol, isopropyl alcohol, butanol or propanol may also be used.

After passing through such processes, a drying process may be performed to produce a polarizing film. The drying process may be performed, for example, at an appropriate temperature for an appropriate time in consideration of the moisture content required for the polarizing film or the like, and such conditions are not particularly limited.

In one example, the polarizing film may comprise a zinc component such as zinc ions to secure high-temperature durability of the polarizing plate.

The content of the zinc component may be further adjusted. For example, the polarizing film may comprise a zinc component (Zn) in amounts of 0.1 to 10 wt %. In another example, the content may be about 0.2 wt % or more or so, 0.3 wt % or more or so, 0.4 wt % or more or so, or 0.5 wt % or more or so, or may be 9 wt % or less or so, 8 wt % or less or so, 7 wt % or less or so, 6 wt % or less or so, 5 wt % or less or so, 4 wt % or less or so, 3 wt % or less or so, 2 wt % or less or so, 1 wt % or less or so, 0.9 wt % or less or so, 0.8 wt % or less or so, 0.7 wt % or less or so, 0.6 wt % or less or so, 0.5 wt % or less or so, 0.4 wt % or less or so, or 0.3 wt % or less or so.

By providing the zinc component in such a form in the polarizing film, it may be possible to provide a polarizing plate having excellent high-temperature durability, which can maintain excellent optical properties even when maintained and/or driven at high temperature.

The present application also relates to a use of the polarizing plate. The polarizing plate can be effectively applied, for example, to an organic light-emitting display device. FIG. 2 is a cross-sectional schematic diagram illustratively showing the organic light-emitting display device. Referring to FIG. 2, the organic light-emitting display device (60) comprises an organic light-emitting display panel (600) and a polarizing plate (10) located on one side of the organic light-emitting display panel (600). The first retardation layer (201) and the second retardation layer (202) of the polarizing plate (10) may be disposed adjacent to the organic light-emitting display panel (600) compared to the polarizing film (100).

The organic light-emitting display panel may comprise a base substrate, a lower electrode, an organic light-emitting layer, an upper electrode and an encapsulation substrate, and the like. One of the lower electrode and the upper electrode may be an anode and the other may be a cathode. The anode is an electrode into which holes are injected, which may be made of a conductive material having a high work function, and the cathode is an electrode into which electrons are injected, which may be made of a conductive material having a low work function. At least one of the lower electrode and the upper electrode may be made of a transparent conductive material, such as ITO or IZO, through which emitted light can be emitted to the outside. The organic light-emitting layer may comprise an organic material capable of emitting light when a voltage has been applied to the lower electrode and the upper electrode.

Additional layers may be further included between the lower electrode and the organic light-emitting layer and between the upper electrode and the organic light-emitting layer. The additional layer may include a hole transporting layer, a hole injecting layer, an electron injecting layer and an electron transporting layer for balancing electrons and holes, but is not limited thereto. The sealing substrate may be made of glass, metal, and/or a polymer, and may seal the lower electrode, the organic light-emitting layer, and the upper electrode to prevent moisture and/or oxygen from being introduced from the outside.

The polarizing plate (10) may be disposed on the side where the light comes out from the organic light-emitting display panel (600). For example, in the case of a bottom emission structure in which light is emitted toward the base substrate, it may be disposed outside the base substrate, and in the case of a top emission structure in which light is emitted toward the sealing substrate, it may be disposed outside the sealing substrate. The polarizing plate (10) can improve display characteristics of the organic light-emitting device by preventing external light from being reflected by reflective layer(s) made of metal such as electrodes and wiring of the organic light-emitting display panel (600), and from coming out of the organic light-emitting device (60). In addition, since the polarizing plate (10) of the present application can exhibit an antireflection effect on the side as well as the front, as described above, the lateral visibility can be improved.

The present application also relates to a display device comprising the organic light-emitting device. In one example, the display device may be a flexible display device. When the organic light-emitting device comprising the polarizing plate of the present application is applied to the display device, other components constituting the device or the like or a method of constituting the device are not particularly limited, and as long as the organic light-emitting device is used, any material or method known in the relevant field may be employed. As the organic light-emitting device comprising the polarizing plate of the present application is applied to the flexible display device, it is possible to provide a flexible display having excellent omnidirectional antireflection performance, folding durability and durability against light having short wavelengths.

The present application can provide a thin polarizing plate having excellent antireflection performance in all directions including the side as well as the front, and having excellent folding durability and durability against light having short wavelengths. In addition, the present application can provide an organic light-emitting display device to which the polarizing plate is applied and a display device comprising the same.

EXPLANATION OF REFERENCE NUMERALS

10: polarizing plate
100: polarizing film
201: first retardation layer
202: second retardation layer
500: hard coating layer
60: organic light-emitting display device
600: organic light-emitting display panel
70: cracks

EXAMPLES

Hereinafter, the contents of the present application will be described in more detail through Examples and Comparative Examples, but the scope of the present application is not limited by the contents presented below.

Production Example 1

A poly(vinyl alcohol) film (Kuraray, TS20) having a thickness of about 20 μm was immersed in a dyeing solution of 28° C. containing 0.3 wt % of iodine ($I_2$) and 3.0 wt % of potassium iodide (KI) for 60 seconds and subjected to dyeing treatment. Subsequently, the dyed polyvinyl alcohol film was immersed in an aqueous solution (crosslinking solution) of 35° C. containing 1 wt % of boron and 3 wt % of potassium iodide (KI) for 60 seconds and subjected to crosslinking treatment. Then, the crosslinked polyvinyl alcohol film was stretched at a draw ratio of 5.4 times by using an inter-roll stretching method. The stretched polyvinyl alcohol film was washed by immersing in ion-exchanged water of 25° C. for 60 seconds, and immersed in an aqueous solution of 25° C. containing about 3 wt % of zinc nitrate for 30 seconds. Then, the polyvinyl alcohol film was dried at a temperature of 80° C. for 60 seconds to produce a polyvinyl alcohol polarizing film.

Example 1

In order to evaluate folding durability and high-temperature durability, a polarizing plate comprising a hard coating layer, a polarizing film, and a laminate of retardation layers sequentially was produced.

As the polarizing film, the polarizing film produced in Production Example 1 was applied. The final thickness of the produced polarizing film was about 7 μm or so, and the zinc component was contained in an amount of about 0.2 to 0.3 wt %.

The laminate of the retardation layers was produced as follows.

First of all, a substantially isotropic triacetyl cellulose film (about 20 μm thick) was prepared, in which a polymerization layer (first liquid crystal retardation layer) of a polymerizable liquid crystal compound (Fuji) having an inverse dispersion characteristic and in-plane retardation of about 141 nm for a wavelength of 550 nm, and capable of acting as a QWP (quarter wave plate) was formed to a thickness of approximately 2 μm on one side. On the first liquid crystal retardation layer of the film, a vertical alignment film was coated in a bar coating method, a polymerizable liquid crystal compound (Merck) was coated on the vertical alignment film, and the polymerizable liquid crystal compound was polymerized in a vertically oriented state to form a positive C film (second liquid crystal retardation layer) having thickness direction retardation of about 62 nm for a wavelength of 550 nm to a thickness of 1 μm, thereby producing a retardation layer with a multilayered structure.

Thereafter, the retardation layer with a multilayered structure was attached to one side of the polarizing film using an optical UV adhesive (thickness: 2 μm). At this time, the surface that the first and second liquid crystal retardation layers were not formed on the triacetyl cellulose film was attached to the polarizing film, and the laminate of the retardation layers was disposed so that the small angle of the angles formed by the slow axis of the first liquid crystal retardation layer and the absorption axis of the polarizing film was 45 degrees.

At the same time, on the other side of the polarizing film, a UV adhesive (LG CHEM) having a hard coating layer function and containing an epoxy compound and an oxetane compound was applied, and the release-treated side of the polyethylene terephthalate film that one side was release-treated was attached to the applied layer of the UV adhesive, and then passed through a UV lamp, thereby forming a hard coating layer having a thickness of approximately 3 μm or so and pencil hardness of 2H or so. The polyethylene terephthalate film was finally peeled off.

As a result, the polarizing plate having a structure such that the hard coating layer/polarizing film/UV adhesive layer/triacetyl cellulose film/first liquid crystal retardation layer/second liquid crystal retardation layer were sequentially laminated was produced. The final thickness of the polarizing plate was about 35 μm.

Comparative Example 1

In order to evaluate folding durability and high-temperature durability, a polarizing plate comprising a cycloolefin film, a polarizing film, a hard coating layer and a laminate of retardation layers sequentially was prepared.

As the polarizing film, the polarizing film prepared in Production Example 1 was applied. The final thickness of the produced polarizing film was about 7 μm or so, and the zinc component was contained in an amount of about 0.2 to 0.3 wt %.

A hard-coated cycloolefin polymer film (Zeon, about 29 μm thick) was attached to one side of the polarizing film using an optical UV adhesive (thickness: 2 μm), and the hard coating layer was coated on the other side of the polarizing film in a bar coating method so that the thickness was about 3 μm.

Meanwhile, the laminate of retardation layers was produced by coating QWP (quarter wave plate) liquid crystals (Fuji) having an inverse dispersion characteristic and in-plane retardation of 141 nm for a wavelength of 550 nm on a positive C film (Merck, thickness about 1 μm) having thickness direction retardation of 62 nm for a wavelength of 550 nm to a thickness of about 2 μm.

Thereafter, the liquid crystal layer part of the laminate of retardation layers was attached to the hard coating layer using a general optical UV adhesive (thickness: 2 μm).

As a result, the polarizing plate having a structure such that the cycloolefin polymer film/UV adhesive layer/polarizing film/hard coating layer/UV adhesive layer/laminate of retardation layers (reverse dispersion QWP/positive C film) were sequentially laminated was produced, and the final thickness of the polarizing plate was about 46 μm.

Evaluation Example 1 Folding Durability Test

After putting the polarizing plates of Examples and Comparative Examples into a folding test chamber (Y.M.RTC, YM-THC 430S), folding durability was evaluated.

At this time, for Examples and Comparative Examples, the conditions were set to be subjected to (1) folding 200,000 times at 25° C./20%, (2) folding 20,000 times at 60° C./20% (3) folding 20,000 times at 60° C./90%, (4) folding 20,000 times at −20° C./0%, and the durability was tested by folding at a rate of 60 times per minute for each condition.

After the end of the test, the polarizing plate was checked for appearance defects such as cracks and tears, and the results were shown in Table 1 and FIGS. 3 and 4.

Evaluation Example 2 Evaluation of Reflective Color Value Change

The polarizing plates of Examples and Comparative Examples were each attached to an OLED panel (reflectance of 55% for a wavelength of 550 nm) such that the first and second retardation layers were closer to the OLED panel than the polarizing film. Then, the color coordinates L, a and b were measured for the polarizing plate before/after the short wavelength test using KONICA MINOLTA's CM-2600d equipment.

In this specification, the short wavelength test is a test in which the polarizing plate is placed in a chamber (Atlas) at a temperature of 25° C., and light having a wavelength of 420 nm is exposed at a light quantity of 0.75 to 0.85 W/m² for 50 hours.

The measurement results and the reflective color value change ($\Delta E^*_{ab}$) values calculated according to Equation 4 below were shown in Table 2.

TABLE 1

| | Folding durability test | | | |
|---|---|---|---|---|
| Classification | (1) | (2) | (3) | (4) |
| Example 1 | X | X | X | X |
| Comparative Example 1 | ○ | X | X | X |

○: crack occurrence
X: no crack
(1) folding 200,000 times at 25° C./20%
(2) folding 20,000 times at 60° C./20%
(3) folding 20,000 times at 60° C./90%
(4) folding 20,000 times at −20° C./0%

TABLE 2

| | Before short wavelength test | | | After short wavelength test | | | |
|---|---|---|---|---|---|---|---|
| Classification | $L_a^*$ | $a_a^*$ | $b_a^*$ | $L_i^*$ | $a_i^*$ | $b_i^*$ | $\Delta E^*_{ab}$ |
| Example 1 | 27.05 | 2.44 | −1.63 | 27.06 | 2.32 | −1.7 | 0.14 |
| Comparative Example 1 | 27.85 | −0.18 | −3.53 | 30.43 | −0.95 | −14.63 | 11.42 |

[Equation 4] $\Delta E^*_{ab} = [(\Delta L^*)^2 + (\Delta a^*)^2 + (\Delta b^*)^2]^{1/2}$ In Equation 4, $\Delta L^*$ is $L^*_a$-$L^*_i$, $\Delta a^*$ is $a^*_a$-$a^*_i$, $\Delta b^*$ is $b^*_a$-$b^*_i$, and $L^*_a$, $a^*_a$ and $b^*_a$ are color coordinates L*, a* and b* before exposing the polarizing plate to light having a wavelength of 420 nm in a light quantity of 0.75 to 0.85 W/m² at a temperature of 25° C. for 50 hours, respectively, and $L^*_i$, $a^*_i$ and $b^*_i$ are color coordinates L*, a* and b* after exposing the polarizing plate to light having a wavelength of 420 nm in a light quantity of 0.75 to 0.85 W/m² at a temperature of 25° C. for 50 hours.

It can be confirmed that as shown in Table 1 above and FIG. 3, in the polarizing plate of Example 1, even after folding 200,000 times (Condition (1)) at 25° C./20%, no crack occurs in the polarizing plate, whereas as shown in Table 1 and FIG. 4, cracks occur in the polarizing plate of Comparative Example 1 after the folding test under the same condition as in Example 1.

As shown in Table 2 above, the polarizing plate of Example 1 also has the reflective color value change ($\Delta E^*_{ab}$)

smaller than that of the polarizing plate of Comparative Example 1, whereby it can be confirmed that the polarizing plate of the present application has excellent short-wavelength durability.

The invention claimed is:

1. A polarizing plate comprising:
a polarizing film;
a hard coating layer formed on top of the polarizing film; and
a retardation layer formed on bottom of the polarizing film; and
an isotropic layer,
wherein the hard coating layer is formed directly on the top of the polarizing film without interposing layers,
wherein the retardation layer is formed on a first surface of the isotropic layer, and a second surface of the isotropic layer is attached to the polarizing film by an UV adhesive layer,
wherein the isotropic layer has an in-plane retardation of 20 nm or less and a thickness direction retardation of 20 nm or less,
wherein a reflective color value change ($\Delta E^*ab$) according to Equation 4 below is 10 or less:

$$\Delta E^*_{ab}=[(\Delta L^*)^2+(\Delta a^*)^2+(\Delta b^*)^2]^{1/2} \qquad \text{[Equation 4]}$$

wherein, $\Delta L^*$ is $L^*_a-L^*_i$, $\Delta a^*$ is $a^*_a-a^*_i$, $\Delta b^*$ is $b^*_a-b^*_i$, and $L^*_a$, $a^*_a$ and $b^*_a$ are color coordinates before exposing the polarizing plate to light having a wavelength of 420 nm in a light quantity of 0.75 to 0.85 W/m² at a temperature of 25° C. for 50 hours, and $L^*_i$, $a^*_i$ and $b^*_i$ are color coordinates after exposing the polarizing plate to light having a wavelength of 420 nm in a light quantity of 0.75 to 0.85 W/m² at a temperature of 25° C. for 50 hours.

2. The polarizing plate according to claim 1, wherein the hard coating layer has pencil hardness of 0.5H or more.

3. The polarizing plate according to claim 1, wherein the hard coating layer has a thickness of 1 μm to 10 μm.

4. The polarizing plate according to claim 1, wherein the polarizing plate has a total thickness of 45 μm or less.

5. The polarizing plate according to claim 1, wherein the retardation layer comprises:
a first retardation layer located on the bottom of the polarizing film, having in-plane retardation according to Equation 1 below of 100 to 150 nm based on a wavelength of 550 nm, and disposed so that a small angle of angles formed by a slow axis with an absorption axis of the polarizing film forms an angle of 35 degrees to 55 degrees; and
a second retardation layer located on a bottom of the first retardation layer and having thickness direction retardation according to Equation 2 below of 30 to 150 nm based on a wavelength of 550 nm:

$$R_{in}=d\times(n_x-n_y) \qquad \text{[Equation 1]}$$

$$R_{th}=d\times(n_z-n_y) \qquad \text{[Equation 2]}$$

wherein, $R_{in}$ is the in-plane retardation, $R_{th}$ is the thickness direction retardation, d is the thickness of a first or second retardation layer, $n_x$ is the refractive index of the first or second retardation layer in the slow axis direction, $n_y$ is the refractive index of the first or second retardation layer in the fast axis direction, and $n_z$ is the refractive index of the first or second retardation layer in the thickness direction.

6. The polarizing plate according to claim 5, wherein the first retardation layer has a dispersion coefficient of less than 1 according to Equation 3 below;

$$\text{Dispersion coefficient}=R_{in}(450)/R_{in}(550) \qquad \text{[Equation 3]}$$

wherein, $R_{in}(450)$ is the in-plane retardation of the first retardation layer based on a wavelength of 450 nm, and $R_{in}(550)$ is the in-plane retardation of the first retardation layer based on a wavelength of 550 nm.

7. The polarizing plate according to claim 1, wherein the ratio (H/S) of a thickness (H) of the hard coating layer to a thickness(S) of the polarizing film is 0.01 to 1.5.

8. The polarizing plate according to claim 1, wherein the ratio (H/T) of a thickness (H) of the hard coating layer to a thickness (T) of the retardation layer is 0.1 to 5.

9. The polarizing plate according to claim 1, wherein the ratio (H/P) of a thickness (H) of the hard coating layer to a thickness (P) of the isotropic layer is 0.01 to 1.5.

10. The polarizing plate according to claim 1, further comprising a pressure-sensitive adhesive layer formed only on a bottom of the retardation layer.

11. An organic light-emitting display device comprising the polarizing plate of claim 1.

12. A display device comprising the organic light-emitting display device of claim 11.

* * * * *